(12) United States Patent
Lindfors et al.

(10) Patent No.: US 6,783,590 B2
(45) Date of Patent: Aug. 31, 2004

(54) METHOD OF GROWING A THIN FILM ONTO A SUBSTRATE

(75) Inventors: Sven Lindfors, Espoo (FI); Pekka T. Soininen, Helsinki (FI)

(73) Assignee: ASM International N.V., Bilthoven (NL)

(*) Notice: Subject to any disclaimer, the term of this patent is extended or adjusted under 35 U.S.C. 154(b) by 32 days.

(21) Appl. No.: 09/835,931

(22) Filed: Apr. 16, 2001

(65) Prior Publication Data

US 2001/0054377 A1 Dec. 27, 2001

(30) Foreign Application Priority Data

Apr. 14, 2000 (FI) .............................................. 20000900

(51) Int. Cl.$^7$ .............................................. C30B 25/14
(52) U.S. Cl. ...................... 117/89; 117/101; 117/102; 117/105; 117/201; 117/202
(58) Field of Search ............................... 117/89, 102, 101, 117/105, 201, 202; 118/715 R

(56) References Cited

U.S. PATENT DOCUMENTS

| | | | |
|---|---|---|---|
| 4,058,430 A | | 11/1977 | Suntola et al. |
| 4,066,481 A | * | 1/1978 | Manasevit et al. ............ 117/89 |
| 4,389,973 A | | 6/1983 | Suntola et al. |
| 5,855,680 A | | 1/1999 | Soininen et al. |

OTHER PUBLICATIONS

Handbook of Crystal Growth 3, Thin Films and epitaxy, Part B. Growth Mechanisms and Dynamics, p. 625.

Niinisto et al., "ALD precursor chemistry: evolution and future challenges," Journal de Physsique IV. vol. 9 (1999), pp. Pr8–837–Pr8–852.

M. Leskela et al., "Synthesis of oxide thin films and overlayers by atomic layer epitaxy for advanced applications," Materials Science & Engineering, vol. B41 (1996), pp. 23–29.

Tuomo Suntola, "Atomic layer epitaxy," Thin Solid Films, vol. 216 (1992), pp. 84–89.

* cited by examiner

*Primary Examiner*—Robert Kunemund
(74) *Attorney, Agent, or Firm*—Knobbe, Martens, Olson & Bear, LLP.

(57) ABSTRACT

A method of growing a thin film onto a substrate placed in a reaction chamber according to the ALD method by subjecting the substrate to alternate and successive surface reactions. The method includes providing a first reactant source and providing an inactive gas source. A first reactant is fed from the first reactant source in the form of repeated alternating pulses to a reaction chamber via a first conduit. The first reactant is allowed to react with the surface of the substrate in the reaction chamber. Inactive gas is fed from the inactive gas source into the first conduit via a second conduit that is connected to the first conduit at a first connection point so as to create a gas phase barrier between the repeated alternating pulses of the first reactant entering the reaction chamber. The inactive gas is withdrawn from said first conduit via a third conduit connected to the first conduit at a second connection point.

33 Claims, 2 Drawing Sheets

METHOD OF GROWING A THIN FILM ONTO A SUBSTRATE

PRIORITY INFORMATION

This application claims the priority benefit under 35 U.S.C. §119 to Finnish Patent Application No. 20000900, filed Apr. 14, 2000, the entire content of which is hereby expressly incorporated by reference.

FIELD OF THE INVENTION

The present invention relates to growing thin films on a surface of a substrate. More particularly, the invention concerns an improved method and apparatus for producing a thin film onto a substrate by subjecting the substrate to alternately repeated surface reactions of vapor-phase reactants.

DESCRIPTION OF THE RELATED ART AND SUMMARY OF THE INVENTION

Conventionally, thin films are grown out using a vacuum evaporation deposition. Molecular Beam Epitaxy (MBE) and other similar vacuum deposition techniques, different variants of Chemical Vapor Deposition (CVD) (including low-pressure and metallo-organic CVD and plasma-enhanced CVD) or, alternatively, the above-mentioned deposition process based on alternate surface reactions, known in the art as the Atomic Layer Deposition, in the following abbreviated ALD, formerly also called Atomic Layer Epitaxy or "ALE". Equipment for the ALD process is supplied under the name ALCVD™ by ASM Microchemistry Oy, Espoo, Finland.

In the MBE and CVD processes, besides other variables, the thin film growth rate is also affected by the concentrations of the provided starting material inflows. To achieve a uniform surface smoothness of the thin films manufactured using these methods, the concentrations and reactivities of the starting materials must be kept equal over the whole surface area of the substrate. If the different starting materials are allowed to mix which each other prior to reaching the substrate surface, as is the case in the CVD method, the possibility of mutual reactions between the reagents is always imminent. Herein arises a risk of microparticle formation already in the infeed lines of the gaseous reactants. Such microparticles generally have a deteriorating effect on the quality of the deposited thin film. However, the occurrence of premature reactions in MBE and CVD reactors can be avoided, e.g., by heating the reactants not earlier than only at the substrates. In addition to heating, the desired reaction can be initiated with the help of e.g., plasma or other similar activating means.

In MBE and CVD processes, the growth rate of thin films is primarily adjusted by controlling the inflow rates of starting materials impinging on the substrate. By contrast, the thin film growth rate in the ALD process is controlled by the substrate surface properties, rather than by the concentrations or other qualifies of the starting material inflows. In the ALD process, the only prerequisite is that the starting material is provided in a sufficient concentration to saturate the surface of the substrate.

The ALD method is described, e.g., in FI Pat. Nos. 52,359 and 57,975 as well as in U.S. Pat. Nos. 4,058,430 and 4,389,973. Also in FI Pat. Nos. 97,730, 97,731 and 100,409 are disclosed some apparatus constructions suited for implementing the method. Equipment for thin film deposition are further described in publications Material Science Report 4(7), 1989, p. 261, and Tyhjiötekniikka (title in English: Vacuum Techniques), ISBN 951-794-422-5, pp. 253–261. These references are incorporated herein by reference.

In the ALD method, atoms or molecules sweep over the substrates thus continuously impinging on their surface so that a fully saturated molecular layer is formed thereon.

According to the conventional techniques known from FI Patent Specification No. 57,975, the saturation step is followed by a protective gas pulse forming a diffusion barrier that sweeps away the excess starting material and the gaseous reaction products from the substrate. Intermixing of the successive reactant pulses must be avoided. The successive pulses of different starting materials and the protective gas pulses forming diffusion barriers that separate the successive starting materials pulses from each other accomplish the growth of the thin film at a rate controlled by the surface chemistry properties of the different materials.

The pulsing of the gaseous reactants and the purge gas is typically controlled by valves.

An essential feature of the ALD process is that condensation of the reactant should be avoided in the vicinity of the reaction chamber. Condensation of the reactant in particular in the conduit between the reactant source and the reaction chamber and on the substrate in the reaction chamber will seriously impair the quality of the thin film. Particles or droplets condensed or sublimed in the reactant feed lines may disperse into the reactant flow and cause inhomogenity on the thin film. The same applies to condensation of solid particles or liquid droplets on the thin film in the reaction chamber. Therefore, an ALD process is operated in such a manner that the temperature in the equipment interconnecting the reactant source and the outlet of the reaction chamber (the "hot zone") is not allowed to drop below the condensation temperature of the reactant.

The temperature of the ALD process is determined by the reactants used and by the applied pressure. Generally it lies in the range between the evaporation temperature and the decomposition temperature of the reactant. Usually the temperature is about 25 to 500° C. There is a distinct trend toward the use of less volatile reactants such as solid or high-boiling precursors. Such reactant sources are easier to handle. However, the applicable temperature range is distinctly higher for these than for the gaseous and liquid reactants. Usually solid sources are used at temperatures in the range of 250 to 500° C., typically 300–450° C. The pressure range is typically about 1 to 100 mbar, preferably less than 50 mbar.

When solid reactant sources are used, a carrier gas typically has to be employed for feeding the reactant vapours into the reaction chamber because the vapour pressure of the source is not always sufficient to allow for a sufficiently strong flow of vapour-phase reactant pulses from the source to the reaction chamber. Since many of the solid sources are powders containing extremely finely divided matter (dust), there is a risk for contamination of the vapour-phase reactant pulses with small solid particles when the carrier gas flow is conducted through the reactant material. These particles disturb the growth of the thin film. Similar problems are encountered with liquid reactants having high boiling points in that the flow of the carrier gas may create a mist with finely divided droplet dispersed in the carrier gas flow. Therefore, the vapour-phase reactant pulses may have to be conducted to a purifier, preferably a static purifier, to remove any liquid or droplets or solid particles present in the gas stream, before the pulses are fed into the reaction chamber. Such purifiers may comprise traditional filters in which the gas stream is conducted through a layer of a porous material having macromolecular pores.

Thus, the basic prerequisites of ALD, via operation above the condensation point of the reactant using reactants which are free from particles or droplets which may disturb the homogeneous growth of the thin film, in combination with the trend towards using reactants having high boiling or sublimation points, gives rise to ever more stringent requirement on the ALD equipment. It is necessary to design the apparatus for reliable operation at high temperatures, typically in the range of about 250 to 500° C., at reduced pressure. Not only should the equipment used in the "hot zone" withstand these temperatures as such, but the materials should also be resistant to the action of the reactive vapourised reactants at said temperatures. These conditions are particularly demanding for mechanical valves conventionally employed for, e.g., pulsing of the reactants and purge gas, and for the gaskets and packings of said valves and other fittings. Attrition of the polymer materials used in the gaskets and packings will cause an additional dusting problem resulting in contamination of the vapour-phase reactant pulses. For several reasons it is therefore necessary to incorporate static purifiers into the ALD equipment designed for the use of solid and/or liquid sources.

It is an object of the present invention to provide a novel method of growing a thin film onto a substrate placed in a reaction chamber according to the ALD process. In particular, it is an object of the invention to provide a method in which the ALD process can be operated using solid or liquid reactant sources and employing a purifier for removing solid particles or liquid droplets emanating from, e.g. the precursor sources, while minimizing the costs and the wear of the process equipment.

These and other objectives, together with the advantages thereof over known processes which shall become apparent from the following specification, are accomplished by the invention as hereinafter described and claimed.

Generally, the present invention is based on the idea that mechanical valves conventionally used for regulating the pulsing of the reactants, i.e. the flow of reactants from precursor sources to the reaction chamber, are replaced by gas flow barriers formed by inert or inactive gas in the conduit interconnecting the reactant source with the reaction chamber. These gas barriers are generated in the time interval between two successive pulses of the same reactant gas. The time interval typically includes a purge pulse, a pulse of another reactant and a further purge pulse.

In practice the invention can be implemented by feeding inactive gas into said interconnecting conduit, which in the following will be called the "first conduit," via a second conduit, connected to the first conduit at a connection point. The inactive gas is then withdrawn from the first conduit via a draining conduit (in the following the "third" conduit) connected to the first conduit. The third conduit by-passes the reactor and it is maintained at a temperature equal to or higher than the condensation of the vapour-phase reactant. By connecting the third conduit to the first conduit at a point upstream of the connection point of the second conduit it becomes possible to form a gas phase barrier which is opposite directed to the flow of vaporised reactants from the reactant source via the first conduit into the reaction chamber.

Considerable advantages are obtained by means of the invention. Thus, by means of the present process moving mechanical parts can be avoided in all or most of the area operated at a temperature above the evaporation temperature. The operation of the present regulating mechanism, in the following also called "inert gas valving" is reliable and it is not sensitive to variations in the chemical character of the precursors. Since it includes no moving parts, the investment costs and the need for maintenance work is strongly reduced. As will be discussed in more detail below, by the inert gas valving system, pulsing of reactants can be carried out by using only one valve which controls the flow of carrier gas from the source of inactive or inert gas to the precursor source. This valve can be kept at ambient temperature and it is not in direct contact with the reactants. By maintaining the temperature of the draining conduit above the evaporation temperature of the reactant, condensation of the reactant in the hot zone of the apparatus can be avoided. There is no build-up of condensated reactants in the third conduit during the purse phase. All parts of the equipment are kept cleaner and there are formed less particles which could be forwarded to the reaction chamber. Precursor waste during the purge cycle can be minimized by providing for static gas flow conditions in the source.

According to a preferred embodiment, wherein the purifier is incorporated into the conduit interconnecting the reactant source with the reaction chamber, the inert gas barrier is arranged downstream of the purifier whereby there is a one-way flow of gas over the purifier during the whole operation of the ALD process. Since the flow direction over and through the purifier does not change, the risk of particles and droplets absorbed in the purifier being released therefrom is eliminated.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

It should also be noted that all of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclose

BRIEF DESCRIPTION OF THE DRAWING

In the following, the invention will be described in greater detail with the help of exemplifying embodiments illustrated in the appended drawings, in which.

DETAILED DESCRIPTION OF THE PREFERRED EMBODIMENT

Figure 1:
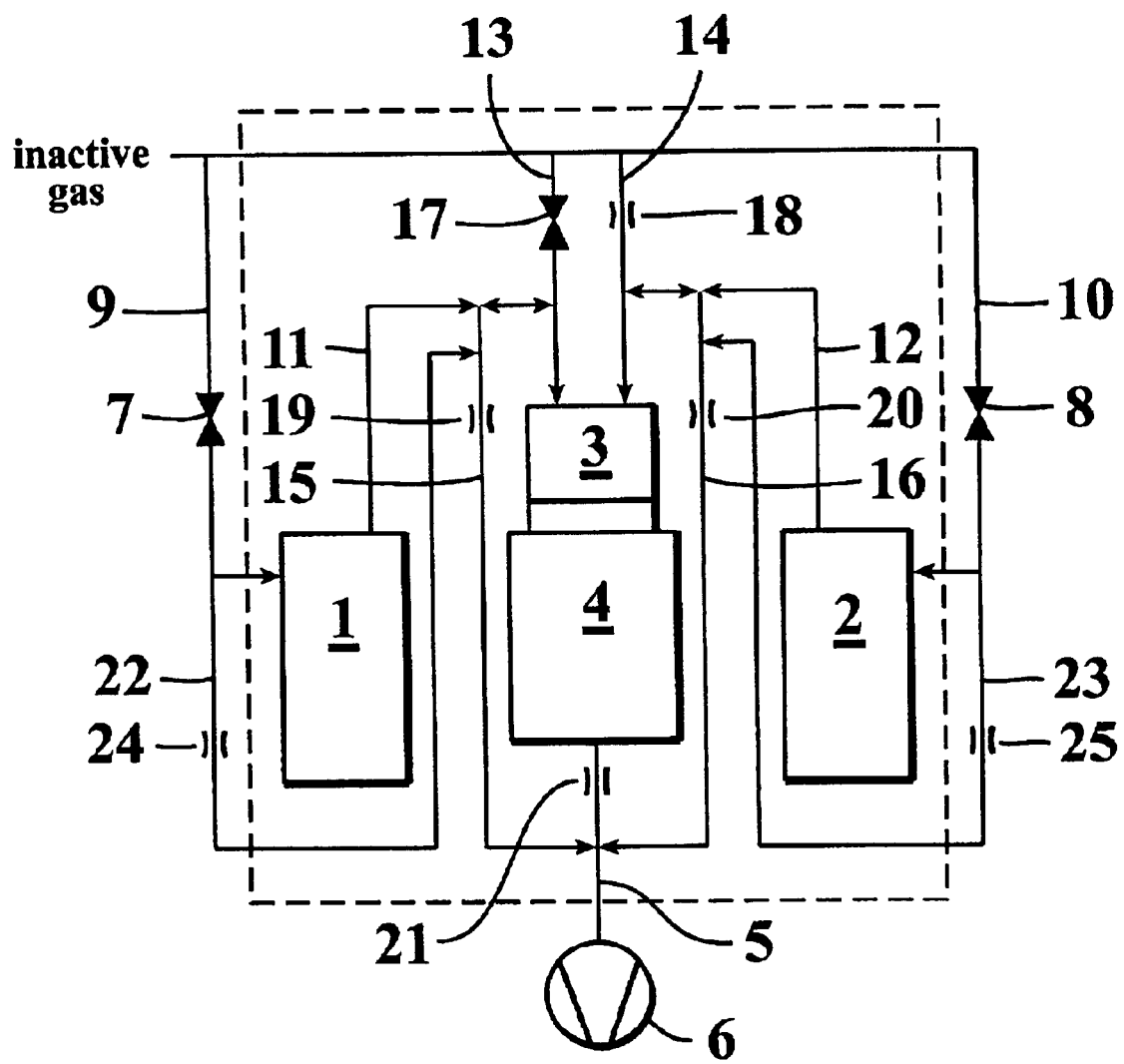
FIG. 1 is a schematic illustration of an apparatus for growing thin films onto the surface of a substrate having certain features and advantages according to the present invention.

The present invention relates to a method of growing a thin film onto a substrate, in which method a substrate is placed in a reaction chamber and said substrate is subjected to surface reactions of a plurality of vapour-phase reactants according to the ALD method to form a thin film.

The method preferably involves vaporising a reactant from a reactant source, conducting the vaporised reactant to the reaction chamber via a first conduit, feeding said reactant into said reaction chamber in the form of vapour-phase pulses repeatedly and alternately with vapour-phase pulses of at least one other reactant, and causing said vapour-phase reactants to react with the surface of the substrate at a reaction temperature to form a thin film compound on said substrate. The vaporised reactant preferably is conducted through a purifier before feeding it into the reaction chamber.

Inactive gas preferably is used for forming a gas phase barrier which prevents leaking of reactant from the reactant feed conduit into the reaction chamber during purging and during feed of another reactant. Thus, a gas phase barrier is generated in the conduit interconnecting the reactant source and the reaction chamber at some point of the conduit either before or after the purifier. The gas phase barrier preferably comprises a flow of inert (in the following more generally "inactive" gas) which is directed in the opposite direction to the flow of vaporized reactant The point at which the inactive gas is introduced from a second conduit into the first conduit is preferably positioned downstream (with respect to the normal flow direction of the reactant gas from the source to the reaction chamber) from the point at which the inactive gas is withdrawn from the conduit. Thus, at least for some length of the first conduit, the inactive gas fed via the second conduit is preferably conducted in opposite direction to the reactant flow.

Summarizing, the barrier zone of the first conduit (which comprises the length of the first conduit between the connecting points of the second and the third conduits) exhibits a gas flow pattern which is generally directed toward the reactor during pulsing and toward the reactant source during inert gas valving. As will be discussed in more detail below, according to a preferred embodiment there may also be formed a barrier zone in the third conduit for reducing the waste of reactant during pulsing.

In the present context, the term "inactive" gas is used to refer to a gas which is admitted into the reaction space and is capable of preventing undesired reactions related to the reactants and the substrate, respectively. In the illustrated method, the inactive gas is also used advantageously as the carrier gas of the vapor-phase pulses of the reactants and, in particular, for providing a gas barrier to the flow of reactant residues into the reaction chamber during the purging of the reaction chamber. Of inactive gases suited for use in the method, reference can be made to inert gases such as nitrogen gas and noble gases, e.g., argon.

"Purging of the reaction chamber" stands for the feed of inactive gas into the reaction chamber between the vapour-phase pulses of the reactants. The purging is carried out in order to reduce the concentration of the residues of the previous vapour-phase pulse before the next pulse is introduced.

In the present context, the term "reactant" refers to a vaporizable material capable of reacting with the substrate surface. In the ALD method, reactants belonging to two different groups are conventionally employed. The reactants may be solids, liquids or gases. The term "metallic reactants" is used of metallic compounds which may even be elemental metals. Suitable metallic reactants are the halogenides of metals including chlorides and bromides, for instance, and organometallic compounds such as the thd complex compounds. As examples of metallic reactants may be mentioned Zn, $ZnCl_2$, $TiCl_4$, $Ca9thd)_2$, $(CH_3)_3Al$ and $Cp_2Mg$. The term "nonmetallic reactants" is used for compounds and elements capable of reacting with metallic compounds. The latter group is appropriately represented by water, sulfur, hydrogen sulfide and ammonia. The term "precursor" is used synonymously with "reactant."

The present invention is particularly well suited to the use of precursors which are liquid or solid at ambient temperature and pressure.

In the illustrated arrangement, "reactant source" denotes a container or similar vessel which is capable of containing the reactant material and in which the reactant can be evaporized. It is generally provided with an inlet nozzle for introduction of a carrier gas into the vessel and with an outlet nozzle, which can be connected to the conduit which interconnects the source with the reaction chamber. The reactant source can be equipped with separate heating means. Alternatively heating can be carried out by feeding heated carrier gas into the vessel. The inlet feed nozzle is generally attached to a flow valve regulating the flow of carrier gas into the reactant source. The outlet nozzle is preferably not connected to a valve but instead it is freely communicating with the first conduit.

In the illustrated arrangement, the "first conduit" is a pipe preferably made from, e.g., metal or glass which interconnects the reactant source with the reaction chamber. As will be explained below, the first conduit is preferably provided with at least two connecting pipe branches, one for introducing inactive gas (connected to the conduit at an inactive gas feed nozzle) and another for withdrawing inactive gas.

A "purifier" can be used to remove impurities, such as fine solid particles and liquid droplets, are removed from the reactant pulses before the reaction chamber. The separation of the impurities can be based on the size of the particles or molecules, but it can also be based on the chemical character and any elastrostatic charge of the impurities. According to a particularly preferred embodiment, the purifier comprises a filter or a molecular sieve. Electrostatic filters can also be used as can chemical purifiers comprising functional groups capable of reacting with specific chemical compounds present (such as water in precursor vapours). the purifier can be fitted into a separate purifying unit or purifier vessel, but is preferred to incorporate the purifier either into the reactant source between the precursor material (surface) or into the first conduit along the flow path of the reactant at a suitable point with respect to the inactive gas feed nozzle.

According to a preferred arrangment, the third conduit comprises an open gas flow channel. The term "open" means that the gas flow channel is not provided with a valve which can be completely closed. It can, however, be provided with flow restrictions such as capillars, which reduce the cross-section of the conduit. The third conduit, which by-passes the reaction chamber, drains the first conduit. In order to avoid condensation, it is maintained at a temperature equal to or higher than the condensation of the vapour-phase reactant. Preferably, the temperature is equal to or lower than the reaction temperature.

The second conduit can be connected to the first conduit at a point between the filter/purifier and the reaction chamber so as to create a one-way gas flow over the filter. In this embodiment, the gas phase barrier is formed between the filter and the reaction chamber. The second conduit can also be connected to the first conduit at a point between the reactant source and the filter.

The third (draining) conduit can be connected to the first conduit at a point between the connection point between the first conduit and the second conduit and the reactant source.

The unreacted vapour-phase reactants are withdrawn from the reaction chamber via an outlet conduit, and the third conduit is preferably connected to that outlet conduit. It is, however, also possible to have the third conduit connected to a separate evacuation means.

According to a preferred arrangement, essentially all of any vapour-phase reactant from the reactant source is conducted via the third conduit to the drain between the feed of vapour-phase reactant pulses into the reaction chamber. Since the third conduit is preferably not closed by a valve during the pulsing of reactants from the reactant source, there is a small flow of precursor from the source to the third conduit during pulsing of the reactant.

The reactant vapour residues withdrawn via the third conduit can be recirculated. However, it is preferred to discard the reactant. According to a modified arrangement, the third conduit is connected to a condensation vessel maintained at a lower pressure and/or temperature in order to provide condensation of vaporised reactant residues.

The flow of inactive gas through the third conduit is preferably smaller than the flow of gas through the first conduit. However, as discussed in the example below, on some occasion there may arise a need for growing the flow through the draining conduit. Typically the flow through the third conduit is about one fifth of that in the first conduit. Preferably it is less than 15%, in particular preferably 10% or less of the flow via the first conduit into the reaction chamber. In order to minimize reactant losses via the third conduit during pulsing, a fourth conduit can be connected to the third conduit. The fourth conduit is used for feeding inactive gas into the third conduit in the opposite direction to the flow of the gas withdrawn from the first conduit. Thus, the inactive gas fed from the fourth conduit will "push" the reactant vapours back towards the first conduit. A further advantage of spearate inactive gas introduction into the third conduit is that the inert gas will be diluted with respect to the precursor, which will reduce the tendency of condensation.

In order to adjust the relative flow rates of the first and the third conduits, it is preferred to incorporate flow restrictors into the third conduit. Such a flow restrictor can be a static restriction such as a capillary portion which can be exchanged depending on the conditions. Since the static restriction contains no moving parts, the durability of it is good.

By feeding the inactive gas from the fourth conduit to a point above the restriction point (i.e. between the flow restriction and the connection point between the first conduit and the third conduit) it becomes possible to form a separated gas barrier zone during pulsing which will reduce the loss of precursor. This feature is discussed in more detail in the example below.

The illustrated arrangement can be carried out in connection with a particular ALD embodiment described in more detail in connection with our co-pending application, Finnish Patent Application No. 20000899, filed Apr. 14, 2000, which is hereby incorporated herein by reference. That embodiment is based on the idea of subjecting the residual components of the previous vapour-phase pulse to a chemical reaction in order to convert said residues into a reaction product which does not interfere with the ALD growth of a thin film on the substrate placed in the reaction chamber. A solid reaction product is produced. The product can be separately removed from the reactor equipment. Preferably, a part of the reactant molecules of the subsequent vapour-phase pulse are sacrificed and used for chemically depleting the residual concentration of the previous vapour-phase pulse. Thus, according to the embodiment, a subsequent vapour-phase pulse is contacted with the residual components of the previous vapour-phase pulse so as to form a reaction product of the reactant of the subsequent vapour-phase pulse with the reactant of the previous vapour-phase pulse before feeding the subsequent vapour-phase pulse into the reaction chamber.

The apparatus of the illustrated ALD arrangement preferably comprises immediately upstream of the reaction chamber a pre-reaction zone, in which the reactants of successive vapour-phase pulses can be reacted with each other in the vapour phase to form a solid product. The pre-reaction zone is preferably operated under conditions conducive to CVD growth of a reaction product between the subsequent vapour-phase pulses, whereas said reaction chamber which forms a second reaction zone is operated under conditions conducive to ALD growth of a thin film.

FIG. 1 depicts a preferred ALD apparatus incorporating a pre-reactor unit. In connection with the drawing, the general principles of the invention will be discussed. The various alternatives of implementing the inactive gas valving concept will be examined more closely with reference to a working example.

The apparatus of FIG. 1 comprises two sources, numbered 1 and 2, for reactants A and B, respectively, a pre-reaction space 3 and a reaction chamber 4. The reaction chamber outlet pipe 5 is provided with a flow restriction 21 and connected to an evacuation pump 6. An inactive gas, such as nitrogen, is used both as a carrier gas for the reactant pulses and for purging the pre-reaction space and the reaction chamber between the reactant gas pulses. A valve 7, 8 is fitted into both of the conduits 9, 10 arranged between the source of inactive gas and the reactant sources 1, 2.

The reactant sources 1, 2 are further connected to the pre-reaction space 3 each by means of a conduit 11 and 12, respectively, which joins the feed lines 13, 14 of inactive gas at a point before the pre-reaction space 3. Both conduits 11 and 12 are connected to the outlet pipe of the reaction chamber via an open conduit 15, 16.

The illustrated arrangement preferably includes a filter, which is not shown in FIG. 1, that is incorporated into conduits 11 and 12 at a point between the reactant sources and the connection points of conduits 15, 16.

The feed lines 13, 14 are provided with valves 17, 18 and the conduits 15, 16 with flow restrictions 19, 20 for directing the reactant gas flow into the pre-reaction space and the reaction chamber rather than into the by-passing draining conduits 15, 16 during reactant pulsing.

The carrier gas conduits 9, 10 are both connected to the draining conduits 15, 16 by means of a by-passing conduit (the "fourth" conduit) 22, 23, which are connected to the draining conduits above the flow restrictions 19, 20. The flow is restricted with a capillar 24, 25.

As indicated by the dashed lines, the reactant sources 1, 2, the pre-reaction space 3 and the reaction chamber 4 and the conduits interconnecting them defines a hot zone within which the temperature is the same as the evaporation temperature of the reactants or higher (i.e. the "hot zone"). Depending on the precursors, typically the temperature is in the range of 25 to 500° C., in particular about 50 to 450° C. The pressure in the reaction chamber and in the gas flow channels freely communicating with the reaction chamber can be atmospheric but it is preferred to operate at reduced pressure, in particular at a pressure in the range of 1 to 100 mbar.

The apparatus is preferably operated as follows: There is a constant flow of gas from the source of inactive gas. When valve 7 is opened, feed line 13 is closed with valve 17. The inactive gas therefore flows through the reactant source (or through the gas space in intimate contact with the reactant material. Thus, there is a flow of precursor A in a carrier gas from the reactant source 1 into the pre-reaction space 3 and the reaction chamber 4. There is also a flow of inactive gas through conduit 22. The inactive gas thus introduced into conduit 15 will form a barrier to the flow of precursor vapours into the draining conduit. When valve 7 is closed and line 13 opened, there is formed a gas phase barrier in the reactant gas line 11 because there is an opposite directed flow of inactive gas from gas line 13 through the part of the gas line 11 which lies between gas line 13 and conduit 15. The reaction space is flushed by the inactive gas fed via line 13.

After flushing there may still remain a weakly bonded residual tail of precursor A on system gas channel surfaces, in particular on the surface of gas line 13 and in the pre-reaction space. When valve 8 is opened and feed lines 13 and 14 closed, precursor B flows into the pre-reaction space 3 and bonds precursor A residuals on the pre-reaction space surface before precursor B continues into the reaction chamber 4. Thus, there is a chemical purge of precursor tails. When the reactants A and B meet in the pre-reaction space, CVD growth will take place. The solid reaction product of the pre-reaction space 3 is removed separately from the ALD grown thin film in the reaction chamber 4. According to a particularly preferred embodiment, the reaction product is deposited on a discardable substrate. The reaction product can, however, also be formed on the inner walls of the apparatus defining the pre-reaction reaction space, whereby the reaction product is removed by cleaning or cleansing the walls.

With respect to the embodiment disclosed in FIG. 1 it should be noted that it is beneficial that there are no moving parts in hot zone. Thus, valves 17 and 18 preferably comprise capillaries instead of conventional mechanical valves. Another option is to place valves 17 and 18 outside the area of the dotted line (the "hot zone"). I that embodiment, the valves are preferably provided with a small bypass for inert gas (or a leaky valve) to prevent the condensation of source chemicals near the valves 17 and 18.

Figure 2:
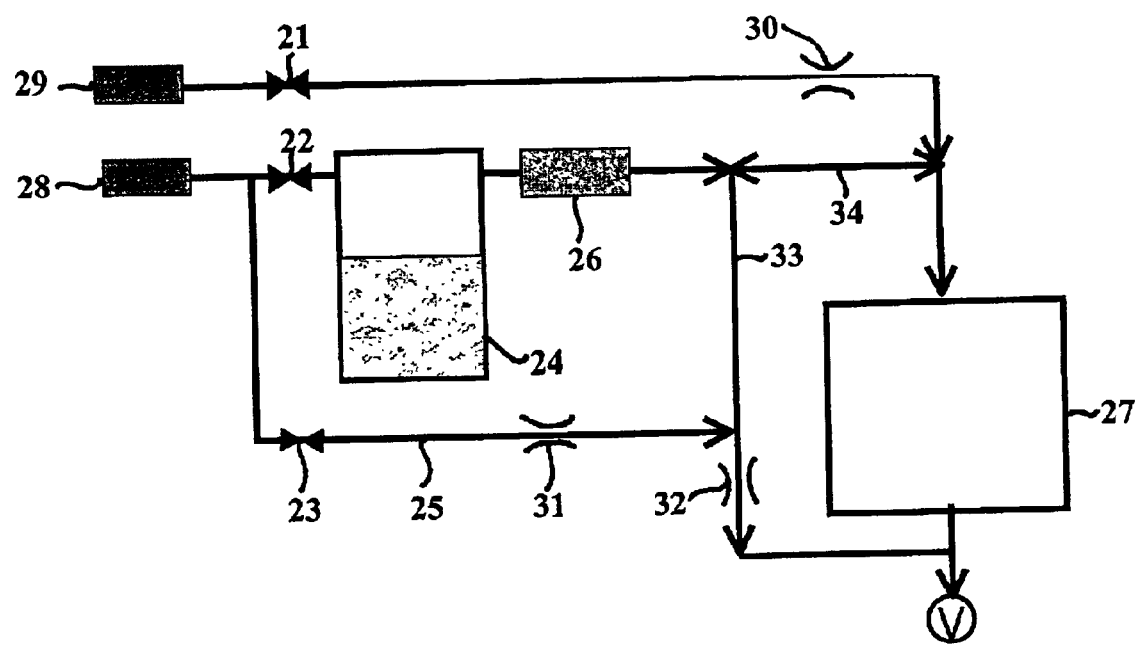
FIG. 2 is a schematic illustration of a modified apparatus for growing thin films onto the surface of a substrate having certain features and advantages according to the present invention.

FIG. 2 depicts a simplified embodiment of the invention comprising an integrated source flow system by use of capillary restrictions, inert gas valving, flush source, hot drain, particle filter and extra inert gas ($N_2$ feed (system pressure is greater than precursor partial pressure $P_s > P_p$). In the figure, reference numerals 21, 22 and 23 refer to valves: valve 21 is for regulating the flow of carrier gas, 22 for regulating flow of purge gas through source 24 (pulsing gas valve), and 23 for regulating flow of purge gas through by-pass line 25) (23 is an extra gas valve). Reference numeral 26 stands for purifier (cf. above) and 27 for the reaction chamber. Numerals 28 and 29 stand for nitrogen sources. Numerals 30 to 32 represent capillary restrictions.

In the embodiment, extra nitrogen is fed from purge gas source 28 for closing the back suction capillary gas line 33 during precursor pulse. In 34 there is formed a diffusion barrier path. The embodiment is useful with a R/C circuit forming source/purifier combination. The particular advantage of the embodiment is that there is no loss of precursor during pulse cycle.

EXAMPLE

A process configuration according to the present invention was tested by building an ALD processing unit using pipes having a diameter of ¼ inches (about 6 mm) and comprising conduits
1) for connecting the reactant source with the reactor (the "first conduit"),
2) for introducing inactive gas into the connection pipe (the "second conduit") and
3) for withdrawing inactive gas from the connection pipe (the "third conduit").

The third conduit was connected to the first conduit at a distance of about 10 cm from the connection point of the second conduit. In the following, the portion of the first conduit extending between these two connection point is called the "barrier zone" or "barrier portion." A porous filter layer was incorporated into the first conduit between the reactant source and the connection point of the third conduit. The reactant sources tested comprised various solid and liquid precursors which were conducted with a carrier gas from the reactant source to the reactor via the first conduit. In the test, the carrier gas comprised nitrogen.

The flow of nitrogenous barrier gas through the second conduit was controlled by a mass flow controller and a valve. The amount of gas drained from the first conduit via the third conduit was controlled by an exchangeable capillary restrictor fitted into the third conduit. A part of the gas fed into the piping (via the second conduit and/or via the reactant source, respectively) was withdrawn through the third conduit and the rest of the gas was conducted through the reactor chamber and withdrawn through the outlet pipe of the reaction chamber.

The gas flow rates were selected such that the gas flow via the third conduit, i.e. the draining conduit, was sufficiently large to prevent diffusion in the connecting conduit (the first conduit) from the reactant source toward the reactor. The amount of any reactant penetrating the barrier zone by diffusion was on the order of 1 ppm. However, the flow rate used in practice was larger in order to maximize the barrier effect. The barrier flow was about 20 sccm ("sccm" or "standard cubic centimetre per minute" stands for $cm^3$ per minute at standard pressure and temperature). When the flow of barrier nitrogen in the barrier state and the flow of the carrier gas for the source during pulsing was 200 sccm, it can be noted that the gas flow through the reactor was about 90% of the total gas flow and about 10% of the flow went to the drain. Thus, a barrier flow can also be generated in the conduit which goes to the reactor (or in fact a flow considerably much stronger than necessary forming the barrier). This flow prevents diffusion from the reactor toward the source.

The piping was dimensioned in such a way that there were two routes available out of the described barrier zone. The ratio between the conductances of the two routes is 1/10 (drain-to-reactor). Then, the flow in the pipe divided up between the flow paths at a ratio corresponding to the ration between the conductances. The barrier zone pressure and the draining pipe pressure are, in practice, somewhat different, otherwise there would not be any gas flow from the barrier zone to the drain, but the pressure difference necessary for producing these small flows is very small in comparison to the pressure difference which is required for obtaining a sufficient gas flow through the drain restriction and through the reactor. If necessary, the variation in the drain flow can be compensated e.g. by over-dimensioning the restriction of the drain. The pressure in the barrier zone was about 3 mbar and the pressure in the pumping line was about 0,1 mbar. When the process was run, there was a small variation of the pressure, because during the barrier phase only carrier gas was fed into the barrier zone, whereas during the pulsing the same amount of gas was conducted into the reactant source as a carrier gas, whereat there was a feed reactant vapours into the first conduit during pulsing.

Pulsing was carried out in such a way that, initially, the reactant source was kept in the barrier phase, i.e. a gas phase barrier was formed in the barrier zone by conducting nitrogen through the second conduit into the barrier zone of the first conduit. In this part of the first conduit the nitrogen flow was divided into two flows, one of which was directed toward the reactor and the other toward the reactant source, whereby a barrier is formed in both directions.

In the barrier zone, that part of the nitrogen flow which was directed toward the source took up any diffusion-conducted precursor molecules and conducted it to the drain. The reactant vapours are then carried through the third conduit and withdrawn from the apparatus.

When the precursor source was activated, the nitrogen flow used for creating the gas phase barrier was conducted through the source as a carrier gas and the flow was directed into the first conduit in which it traversed the filter and entered the barrier portion of the first conduit. Since the third conduit was open, the flow was divided into two portions, one of which (the smaller portion) entered the third conduit whereas the major portion (90%) was conducted to the reactor. After the reaction, the unreacted residues along with the carrier gas were combined with the gas flow which was conducted through the third conduit before the pump.

In the illustrated arrangement, the flow of gas in the barrier zone of the first conduit is directed towards the reactant source during the barrier phase and towards the reactor during the pulsing of the reactant.

Since the pressure increases somewhat in the conduits of the apparatus during pulsing because of the evaporation of the reactants, two alternative embodiment were tested for maintaining essentially constant pressure during the whole process. In the first alternative, the carrier gas flow rate was somewhat reduced during pulsing. In the second alternative, nitrogen feed directly into the draining conduit (the third conduit) was tested. The flow rate of this feed was about 1/10 of the total flow. This flow went mainly into the drain and, as a result, no reactant was wasted by being conducted into the drain during pulsing.

The use of this kind of nitrogen flow, which is conducted to the drain, is preferred also when the filter has low conductivity (tight filter). The filter forms an RC circuit (Resistance-Condensator) together with the volume of the reactant source (vessel). During pulsing the pressure in the reactant source increases in order to provide a gas flow of desired magnitude through the filter.

During the barrier phase the pressure is slowly discharged through the filter, in other words, there is a leak gas flowing from the source to the barrier portion. If this gas flow is so large that it corresponds to that portion of the total gas flow which flows through the drain (or even larger than that) then there is not a barrier flow having the right direction (i.e. directed toward the source) or the flow rate of the barrier flow is not sufficiently large. In this case, there has to be a delay in the operation of the machine until a suitable barrier flow is formed in the barrier zone. This makes the apparatus slow and impairs productivity. The speed of the apparatus can be increased by growing the ratio between the drain flow and the flow to the reactor from about 1/10 to 1/1 or even greater. Then the required flow of some sccm's in the barrier portion can be attained even when the discharge flows are large. On the other hand, now another problem is faced, namely the flow into the drain during the pulsing phase becomes large, half (or more) of the reactant flowing into the third conduit and into the drain, whereas only half (or even less) is conducted into the reactor. To eliminate or to reduce the extent of the problem inactive gas can be pulsed into the third conduit during the pulsing of the reactant. Preferably the inactive gas is connected into the third conduit before (above) the capillary restrictor. This inactive gas is sacrificed, it flows partly into the drain and the reactant gas flows into the reactor. Thus, in this embodiment, a barrier flow is formed in the third conduit during pulsing of the reactant to the reactor chamber. By the amount of barrier gas introduced it is possible to adjust the pressure in the piping so that it is constant during the process.

The flow conducted to the drain can also be regulated with a valve.

The important advantage of the above arrangements is that the apparatus does not need pulsating valves operated in the hot zone and the use of the apparatus is not limited to any specific temperature range, provided that the material of the pipes withstands the conditions.

For closing the reactant sources between successive runs and for maintenance and safety reasons other components, such as resistances, pressure meters and valves can be incorporated into the equipment.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

We claim:

1. A method for growing thin films onto a surface of a substrate by exposing the substrate to alternatively repeated surface reactions of vapor-phase reactants, the method comprising the steps of:
   providing a first reactant source;
   providing am inactive gas source;
   feeding a first reactant from the first reactant source in the form of repeated alternating pulses to a reaction chamber via a first conduit;
   allowing the first reactant to react with the surface of the substrate in the reaction chamber;
   feeding inactive gas from the inactive gas source into the fist conduit via a second conduit that is connected to the first conduit at a first connection point so as to create a gas phase barrier between the repeated alternating pulses of the first reactant entering the reaction chamber; and
   withdrawing the inactive gas from said first conduit via a third conduit connected to the first conduit at a second connection point.

2. The method of claim 1, further comprising the step of providing the second connection point upstream of the first connection point so that, at least for some length of the first conduit, the inactive gas fed into the first conduit flows upstream towards the first reactant source.

3. The method according to claim 1, wherein the step of providing a first reactant source comprises vaporizing the first reactant.

4. The method according to claim 3, wherein the step of providing a first reactant source further comprising maintaining the first reactant source at least at a vaporizing temperature of the first reactant.

5. The method of claim 1, wherein the step of providing a first reactant source comprises freeing solid reactant from solid particles located within the first reactant source.

6. The method of claim 1, wherein the step of providing a first reactant source comprises freeing liquid reactant from a suspended liquid in the first reactant source.

7. The method of claim 1, further comprising the steps of providing a purifier and passing the first reactant through the purifier before transferring the first reactant into the reaction chamber.

8. The method of claim 7, wherein the purifier is a filter comprising at least one of a ceramic molecular sieve and an electrostatic filter capable of separating one of at least dispersed liquid, solid droplets, particles and molecules of a minimum molecular size from the reactant gas flow.

9. The method according claim 7, wherein the purifier is an active purifier comprising functional groups capable of reacting with components present in the reactant gas flow.

10. The method of claim 7, wherein the step of providing a purifier further includes providing the purifier along the first conduit between the second connection point and the first reactant source.

11. The method of claim 10, further including only passing the first reactant over the purifier in a signal direction.

12. The method according to claims 10, further comprising the step of forming the gas phase barrier between the purifier and the reaction chamber.

13. The method according to claim 1, further comprising providing the second connection point between the first connection point and the first reactant source.

14. The method of claim 1, further comprising the step of maintaining the third conduit at a temperature at least equal to a condensation temperature of the first reactant.

15. The method according to claim 1, further comprising the step of maintaining the second conduit at a temperature no greater than a reaction temperature of the reaction chamber.

16. The method according to claim 1, wherein the third conduit is an open gas flow channel.

17. The method according to claim 1, wherein the third conduit does not include valves.

18. The method according to claim 1, wherein the first conduit does not include valves.

19. The method according to claim 1, further comprising the steps of providing an outlet conduit for withdrawing unreacted reactants from the reaction chamber and connecting the third conduit to the outlet conduit.

20. The method according to claim 1, further comprising the steps of providing an outlet conduit for withdrawing unreacted reactants from the reaction chamber and connecting the third conduit to a separate outlet conduit.

21. The method according to claim 1. further comprising the steps of connecting a second inactive gas source to an inlet of the first reactant source and using inactive gas from the second inactive gas source as a carrier gas for the first reactant.

22. The method according to claim 3, further comprising the steps of connecting the inactive gas source to an inlet of the first reactant source and using inactive gas from the second inactive gas source as a carrier gas for the first reactant.

23. The method according to claim 1, further comprising the steps of draining substantially all of the first reactant from the reactant source through the third conduit to between the repeated alternating pulse of the first reactant.

24. The method according to claim 1, further comprising the steps of providing a condensation vessel and connecting the condensation vessel to the third conduit and condensing vaporized reactant residues in the condensation vessel.

25. The method according to claim 1, further comprising connecting a second inactive gas source to the third conduit via a fourth conduit and feeding inactive gas into the third conduit.

26. The method according to claim 25, further comprising using the inactive gas fed into the third conduit via the fourth conduit to reduce an amount of gas withdrawn from the first conduit.

27. The method according to claim 1, further comprising connecting the inactive gas source to the third conduit via a fourth conduit and feeding inactive gas into tile third conduit.

28. The method according to claim 27, further comprising using the inactive gas fed into the third conduit via the fourth conduit to reduce au amount of gas withdrawn from the first conduit.

29. The method according to claim 28, further comprising feeding the inactive gas into the third conduit via the fourth conduit when the first reactant is being fed into the reaction chamber wherein the inactive gas is fed during pulsing of the reactant.

30. The method according to claim 1, further comprising connecting the inactive gas source to the third conduit via a fourth conduit upstream of a flow restrictor and feeding inactive gas into the third conduit.

31. The method according to claim 1, further comprising feeding inactive gas into the reaction chamber in-between the repeated alternating pulses of the first reactant.

32. The method according to claim 1, further comprising the steps of alternately, with respect to the first reactant, transferring a second reactant into the reaction chamber and allowing the second reactant to react with the surface of the substrate in the reaction chamber.

33. The method according to claim 1, further comprising the steps of:

providing a second reactant source;

transferring a second reactant from the second reactant source to the reaction chamber via a fourth conduit;

alternately, with respect to the first reactant, allowing the second reactant to react with the surface of the substrate in the reaction chamber;

feeding inactive gas from the inactive gas source into the fourth conduit via a fifth conduit that is connected to the fourth conduit at a third connection point so as to create a second gas phase barrier between repeated alternating pulses of the second reactant entering the reaction chamber; and withdrawing the inactive gas from said fourth conduit via a sixth conduit connected to the fourth conduit at a fourth connection point.

* * * * *

UNITED STATES PATENT AND TRADEMARK OFFICE
CERTIFICATE OF CORRECTION

PATENT NO. : 6,783,590 B2 Page 1 of 1
APPLICATION NO. : 09/835931
DATED : August 31, 2004
INVENTOR(S) : Sven Lindfors and Pekka T. Soininen It is certified that error appears in the above-identified patent and that said Letters Patent is hereby corrected as shown below:

| Column | Line | Description of Error |
|--------|------|----------------------|
| 12 | 25 | In Claim 1, delete "am" and insert - - an - -, therefor. |
| 12 | 32 | In Claim 1, delete "fist" and insert - - first - -, therefor. |
| 13 | 8 | In Claim 12, delete "claims" and insert - - claim - -, therefor. |
| 13 | 32 | In Claim 21, delete "claim 1." and insert - - claim 1, - - therefor. |
| 13 | 36 | In Claim 22, delete "claim 3" and insert - - claim 1 - -, therefor. |
| 14 | 7 | In Claim 27, delete "tile" and insert - - the - -, therefor. |
| 14 | 12 | In Claim 28, delete "au" and insert - - an - -, therefor. |

Signed and Sealed this

Fifteenth Day of August, 2006

JON W. DUDAS
*Director of the United States Patent and Trademark Office*